(12) United States Patent
Yi et al.

(10) Patent No.: US 11,336,491 B2
(45) Date of Patent: May 17, 2022

(54) DECISION FEEDBACK EQUALIZER

(71) Applicant: Nippon Telegraph and Telephone Corporation, Tokyo (JP)

(72) Inventors: Il-Min Yi, Tokyo (JP); Naoki Miura, Tokyo (JP); Hiroyuki Fukuyama, Tokyo (JP); Hideyuki Nosaka, Tokyo (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 0 days.

(21) Appl. No.: 17/272,180

(22) PCT Filed: Sep. 11, 2019

(86) PCT No.: PCT/JP2019/035680
§ 371 (c)(1),
(2) Date: Feb. 26, 2021

(87) PCT Pub. No.: WO2020/066612
PCT Pub. Date: Apr. 2, 2020

(65) Prior Publication Data
US 2021/0288846 A1    Sep. 16, 2021

(30) Foreign Application Priority Data
Sep. 25, 2018  (JP) .............................. JP2018-178477

(51) Int. Cl.
*H04L 25/03* (2006.01)
*H03F 3/193* (2006.01)
*H03K 3/037* (2006.01)

(52) U.S. Cl.
CPC ....... *H04L 25/03057* (2013.01); *H03F 3/193* (2013.01); *H03K 3/037* (2013.01); *H03F 2200/372* (2013.01)

(58) Field of Classification Search
CPC ............... H04L 25/03057; H03F 3/193; H03F 2200/372; H03K 3/037
See application file for complete search history.

(56) References Cited

U.S. PATENT DOCUMENTS

| 7,567,616 B2* | 7/2009 | Lin .................... H04L 25/03057 375/233 |
| 8,085,841 B2* | 12/2011 | Bulzacchelli ..... H04L 25/03019 375/233 |
| 9,876,656 B1* | 1/2018 | Freitas .............. H04L 25/03878 |

(Continued)

OTHER PUBLICATIONS

Bae, et al., "A 60nm 6Gb/s/pin GDDR5 Graphics DRAM withMultifaceted Clocking and ISI/SSN ReductionTechniques," IEEE ISSCC Dig Tech Papers, 2008, 3 pages.

*Primary Examiner* — Freshteh N Aghdam
(74) *Attorney, Agent, or Firm* — Slater Matsil, LLP (57) ABSTRACT

An amplifier output from an amplifier to an SR latch is used as a feedback signal through a buffer. An adder having a combination of an addition unit and an xh block is provided within the amplifier and transmits a feedback signal (analog signal) generated from the feedback signal FBD (digital signal) by the xh block to the addition unit and adds it to an output from a latch block. In the amplifier, the operation for adding the output from the latch block and the feedback signal occurs during a latch operation in the latch block.

10 Claims, 9 Drawing Sheets

(56) References Cited

U.S. PATENT DOCUMENTS

| | | | | |
|---|---|---|---|---|
| 2015/0019770 A1* | 1/2015 | Chen | ................ | H04L 25/03057 |
| | | | | 710/104 |
| 2016/0294537 A1* | 10/2016 | Hoshyar | ........... | H04L 25/03267 |
| 2017/0264467 A1* | 9/2017 | Neto | .................. | H04L 25/0272 |

* cited by examiner

DECISION FEEDBACK EQUALIZER

CROSS-REFERENCE TO RELATED APPLICATIONS

This application is a national phase entry of PCT Application No. PCT/JP2019/035680, filed on Sep. 11, 2019, which claims priority to Japanese Application No. 2018-178477, filed on Sep. 25, 2018, which applications are hereby incorporated herein by reference.

TECHNICAL FIELD

The present invention relates to a decision feedback equalizer that compensates an intersymbol interference caused by a dispersion property of a channel coupling a transmitter and a receiver.

BACKGROUND

A data communication system such as a local area network includes a transmitter (TX), a channel (transmission path), and a receiver (RX). The transmitter receives a data signal and transmits an analog signal. The analog signal transmitted from the transmitter is transmitted to the receiver through the channel. The receiver converts the analog signal (output signal from the channel) transmitted through the channel to a digital signal of "o" or "1" by comparing the analog signal with a reference voltage.

The analog signal (TX output) output from the transmitter includes serial symbol data divided by unit times (hereinafter, "UI") depending on clock cycles (TX clock cycles) in the transmitter.

In a case where the time interval of the symbol data is a time interval for one UI in the TX output, the time interval of the symbol data is extended to a time interval for several UIs due to the dispersion property of the channel in the output signal from the channel, that is, the signal (RX input) input to the receiver. Because of the extension, some symbol data overlap. For that, a part of the last data (symbol data that are input last time) remaining in the current data (symbol data that are input this time) causes an intersymbol interference (ISI).

Thus, it is difficult for the receiver to perform proper determination on the current data, and an improper digital output may be generated in the receiver. Therefore, in order for the receiver to perform the proper determination, the intersymbol interference is required to be compensated.

For compensating the intersymbol interference, a decision feedback equalizer (DFE) is used at a frontend of the receiver. In the decision feedback equalizer, the intersymbol interference by the last data is removed from the current data through the use of a feedback signal depending on the amount of the intersymbol interference generated from the last data. Thus, the intersymbol interference is compensated, and the proper determination can be performed on the current data.

Figure 5:
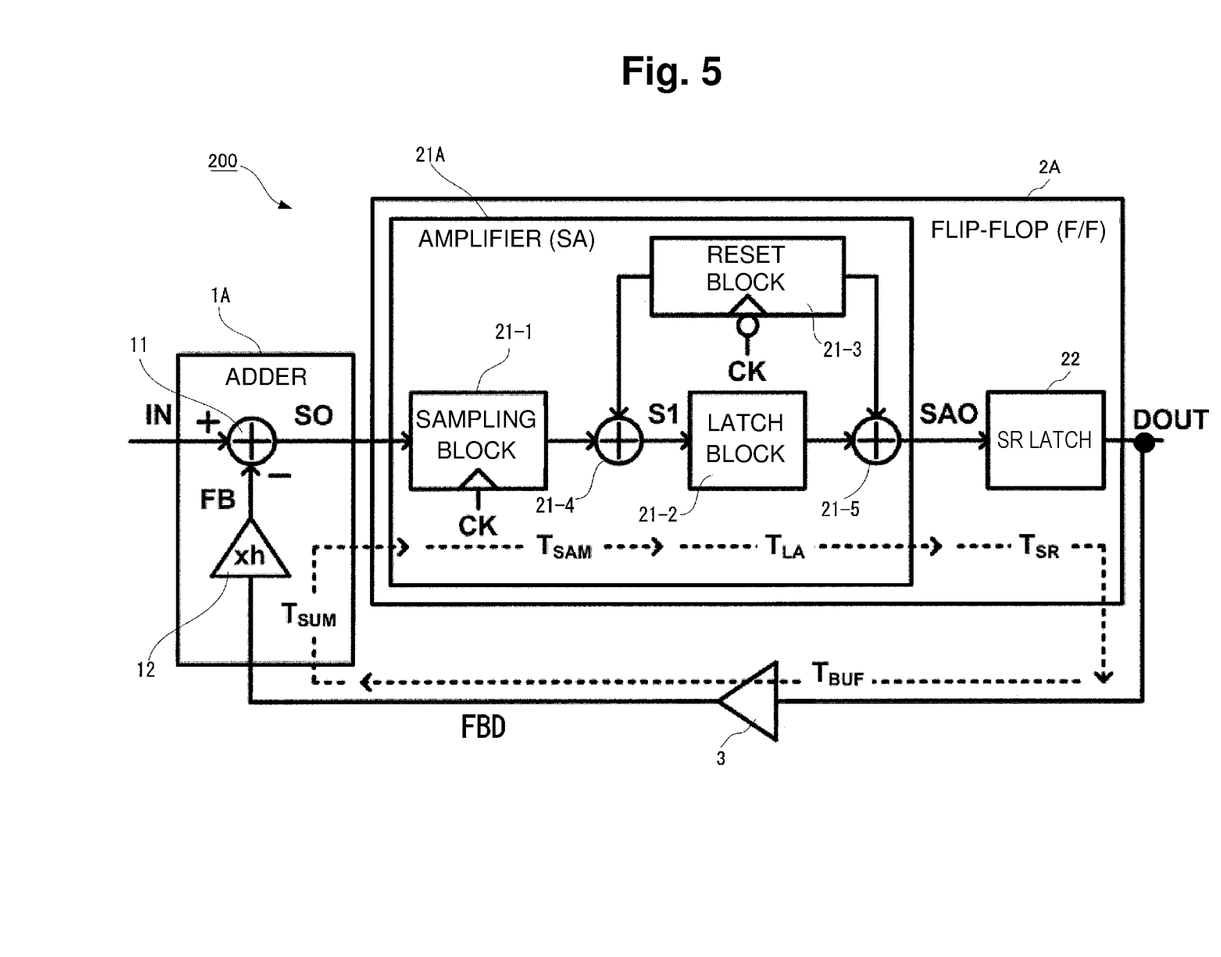
FIG. 5 is a diagram showing a configuration of essential parts of a conventional DFE.

FIG. 5 shows a configuration of essential parts of a conventional decision feedback equalizer (DFE) 200. The DFE 200 includes an adder 1A, a flip-flop (F/F) 2A, and a buffer 3.

In the DFE 200, the adder 1A has an addition unit 11 and an xh block (feedback signal generation unit) 12 and receives, as an input signal IN, an analog signal (RX input) transmitted from a transmitter to a receiver through a channel and generates an adder output SO by adding (adding by inverting the symbol of) a feedback signal FB (analog signal) generated in the xh block to the input signal IN.

In the adder 1A, the feedback signal FB to be given to the addition unit 11 has a value of +h or −h in order to remove the intersymbol interference. Here, h is a variable depending on the amount of the intersymbol interference (ISI) occurring in the input signal IN due to the last data. Because of the addition of the feedback signal FB to the input signal IN, the intersymbol interference is removed from the input signal IN, and the adder output SO becomes a signal not having an influence of the intersymbol interference.

The symbol of the value of h that the feedback signal FB has depends on an output (flip-flop output) DOUT of the flip-flop 2A. The flip-flop 2A has an amplifier (SA) 21A and an SR latch (latch circuit) 22 and generates the flip-flop output DOUT for each sampling cycle of a clock signal CK by comparing the adder output SO from the adder 1A with a reference voltage (VR). Normally, the sampling cycle of the clock signal CK is equal to the UI of the RX input.

The amplifier 21A has a sampling block 21-1, a latch block 21-2, a reset block 21-3, and addition units 21-4 and 21-5. The amplifier 21A generates an amplifier output SAO, and the amplifier output SAO is a return-to-zero (RZ) digital signal. The amplifier output SAO alternately has two states of a reset state (return-to-zero state) and a data state ("i" or "o") in a time domain.

In the amplifier 21A, when the clock signal CK has "Low", the amplifier output SAO has the reset state. In this case, an input (latch block input) S1 to be input to the latch block 21-2 and the amplifier output SAO are pre-charged by the reset block 21-3 so as to have a specific voltage (VDD).

When the clock signal CK is shifted to "High", the sampling block 21-1 starts a sampling operation, and the reset block 21-3 cancels the pre-charging of the latch block input S1 and the amplifier output SAO. Thus, the amplifier output SAO has a VDI. Here, the VDI is a voltage value in proportion to "SO−VR" (a difference between SO and VR) at the sampling time.

After that, the latch block 21-2 starts a latch operation and converts the analog signal having VDI to a digital signal ("1"/"0") with a large voltage gain. After the latch operation, the amplifier output SAO is a digital signal. When the clock signal CK has "High", the amplifier output SAO has the data state.

The subsequent SR latch 22 converts the amplifier output SAO (which is a return-to-zero (RZ) digital signal) to a non-return-to-zero (NRZ) digital signal by removing the reset state from the amplifier output SAO.

The output DOUT (flip-flop output DOUT) from the SR latch 22 is fed back to the adder 1A through the buffer 3 as a feedback signal FBD (digital signal). In the adder 1A, the feedback signal FBD (digital signal) is converted to a feedback signal FB (analog signal) depending on the amount of the intersymbol interference by the xh block 12 and is transmitted to the addition unit 11.

Figure 6:
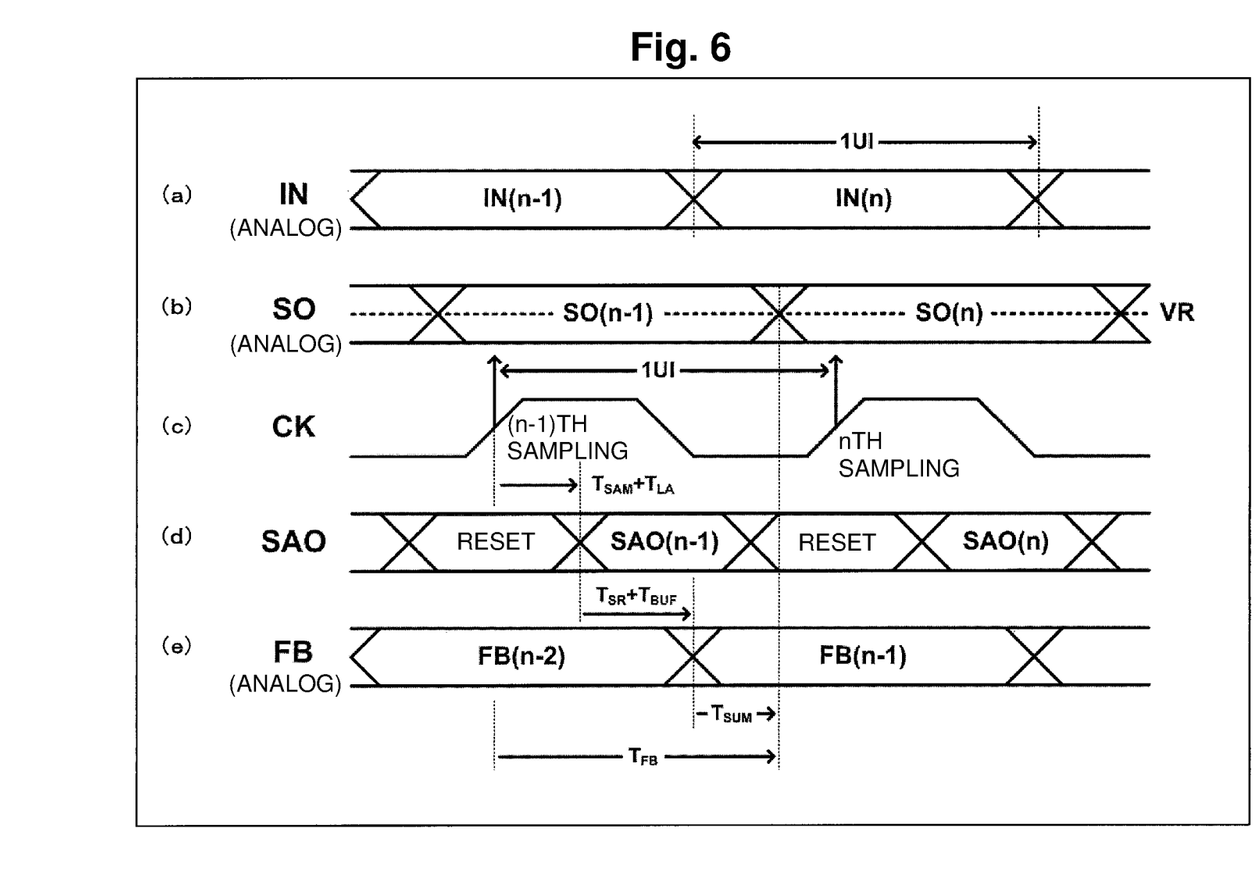
FIG. 6 is a timing chart showing operations of the DFE shown in FIG. 5.

FIG. 6 shows a timing chart indicating operations of the DFE 200. In the DFE 200, the adder 1A generates an adder output SO(n) by adding an input signal IN(n) and a feedback signal FB (n−1) in the addition unit 11.

The input signal IN(n) and the adder output SO(n) are the n-th data of the input signal IN and the n-th data of the adder output SO, respectively, and are data at the n-th sampling time of the clock signal CK. The feedback signal FB(n−1) is the (n−1)th feedback signal FB by the (n−1)th sampling of the clock signal CK.

When the flip-flop output DOUT(n−1) is "1", the feedback signal FB(n−1) is +h. Therefore, the adder output SO is $SO(n)=IN(n)-h$. VR is normally 0. When the flip-flop output DOUT(n−1) is "0", the feedback signal FB(n−1) is −h. Therefore, the adder output SO is $SO(n)=IN(n)+h$. Here, h is a variable depending on the amount of the intersymbol interference described above and is controlled in the xh block 12.

Because of a gain (α) of the sampling block 21-1, SAO(n) is $a*\{IN(n)\pm h\}$. In order to properly remove the intersymbol interference, the adder output SO(n) which is a result of addition of the input signal IN(n) and the feedback signal FB(n−1) is required to be settled before the n-th sampling of the clock signal CK.

Therefore, in a case where the time from the (n−1)th sampling of the clock signal CK to the settling of the value of the adder output SO(n) is a feedback loop delay $T_{FB}$, the feedback loop delay $T_{FB}$ is required to be smaller than one UI.

In other words, in order to properly remove the intersymbol interference, a relationship $T_{FB}=T_{SAM}+T_{LA}+T_{SR}+T_{BUF}+T_{SUM}<1$ UI is required to be satisfied. Here, $T_{SAM}$, $T_{LA}$, $T_{SR}$, $T_{BUF}$, and $T_{SUM}$ are propagation delays in the sampling block 21-1, the latch block 21-2, the SR latch 22, the buffer 3, and the adder 1A, respectively. Because of this requirement, the operational data rate of the receiver is limited.

Figure 7:
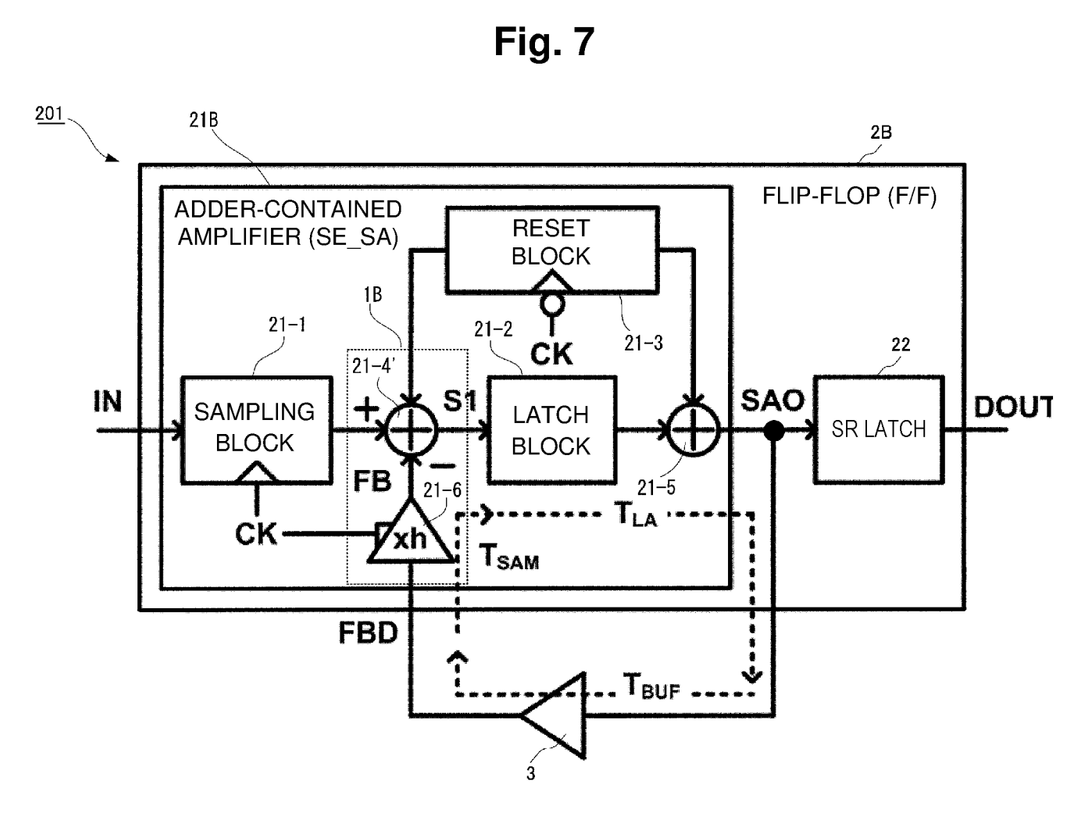
FIG. 7 is a diagram showing a configuration of essential parts of a conventional DFE using an adder-contained amplifier.

Here, as a method for increasing the operational data rate of the receiver, that is, as a method for rapidly operating the receiver, reducing the feedback loop delay $T_{FB}$ may be considered. In order to realize that, two techniques are generally applied (see Non-Patent Literature 1, for example). FIG. 7 shows a configuration of essential pails of a DFE 201 applying the two techniques.

In the DFE 201, according to a first technique, instead of the flip-flop output DOUT, the amplifier output SAO to the SR latch 22 is used as a feedback signal FBD through the buffer 3. Also, in the DFE 201, according to a second technique, an amplifier (adder-contained amplifier (SE_SA)) 21B containing an adder 1B is used.

In other words, in the DFE 201, the adder 1B having a combination of an addition unit 21-4' and an xh block 21-6 is provided in an amplifier 21B such that the xh block 21-6 transmits a feedback signal FB (analog signal) generated from the feedback signal FBD (digital signal) to the addition unit 21-4'.

In the DFE 201, an operation for adding an output from the sampling block 21-1 and a feedback signal FB from the xh block 21-6 in the adder 1B occurs during a sampling operation in the sampling block 21-1.

Thus, the delay time $T_{SUM}$ in the adder 1A shown in FIG. 5 is removed in addition to the propagation delay $T_{SR}$ in the SR latch 22, and the feedback loop delay $T_{FB}$ is reduced to $T_{SAM}+T_{LA}+T_{BUF}$. Therefore, the operational data rate of the receiver can be increased.

CITATION LIST

Non-Patent Literature

Non-Patent Literature 1: S.-J. Bae et al, "A 60 nm 6 Gb/s/pin GDDR5 Graphics DRAM with Multifaceted Clocking and ISI/SSN-Reduction Techniques," in IEEE ISSCC Dig. Tech. Papers, February 2008, pp. 278-279.

SUMMARY

Technical Problem

However, there is a problem that, when the operational data rate of the receiver is further increased, even the DFE 201 having a feedback loop delay $T_{FB}$ reduced by application of the two techniques is not enough, and it is difficult to compensate the intersymbol interference of a high speed signal.

Embodiments of the present invention are made to solve such a problem, and it is an object of embodiments of the present invention to realize a decision feedback equalizer that can further reduce the feedback loop delay $T_{FB}$ and compensate an intersymbol interference of a high speed signal.

Means for Solving the Problem

In order to achieve the object, a decision feedback equalizer (100) according to embodiments of the present invention that compensates an intersymbol interference (ISI) caused by a dispersion property of a channel coupling a transmitter (TX) and a receiver (RX) includes an amplifier (21C) receiving, as an input signal (IN), an analog signal transmitted from the transmitter to the receiver through the channel, and amplifying and outputting the input signal as a return-to-zero digital signal (SAO), a latch circuit (22) latching and outputting the output from the amplifier as a non-return-to-zero digital signal (DOUT), and a buffer (3) provided on a path for feeding back the output from the amplifier to the amplifier. In this case, the amplifier includes a sampling block (21-1) sampling and outputting the input signal at predetermined cycles, a latch block (21-2) latching and outputting the output from the sampling block, an adder (1C) having a feedback signal generation unit (21-7) generating a feedback signal (FB) depending on an amount of the intersymbol interference from the output (FBD) from the amplifier, which is fed back through the buffer, and an addition unit (21-5') adding the feedback signal generated by the feedback signal generation unit to the output from the latch block, and a reset block (21-3) controlling input timing of the output from the sampling block to the latch block and input timing of the output from the latch block to the addition unit.

In embodiments of the present invention, the adder provided within the amplifier generates a feedback signal from an output from the amplifier, which is fed back through the buffer, adds and outputs the generated feedback signal and an output from the latch block as an output from the amplifier. In this case, the operation for adding the output from the latch block and the feedback signal in the adder occurs during a latch operation in the latch block. Thus, the delay time $T_{SAM}$ is removed, and the feedback loop delay $T_{FB}$ is reduced to $T_{LA}+T_{BUF}$.

Note that, in the description above, the constituent elements and the like in the figures corresponding to the constituent elements of embodiments of the present invention are indicated by reference signs within parentheses.

Effects of the Invention

As described above, according to embodiments of the present invention, because the operation for adding an output from the latch block and a feedback signal in the adder occurs during a latch operation in the latch block, the feedback loop delay $T_{FB}$ can be further reduced, and the intersymbol interference of a high speed signal can be compensated.

DETAILED DESCRIPTION OF ILLUSTRATIVE EMBODIMENTS

Embodiment 1

Figure 1:
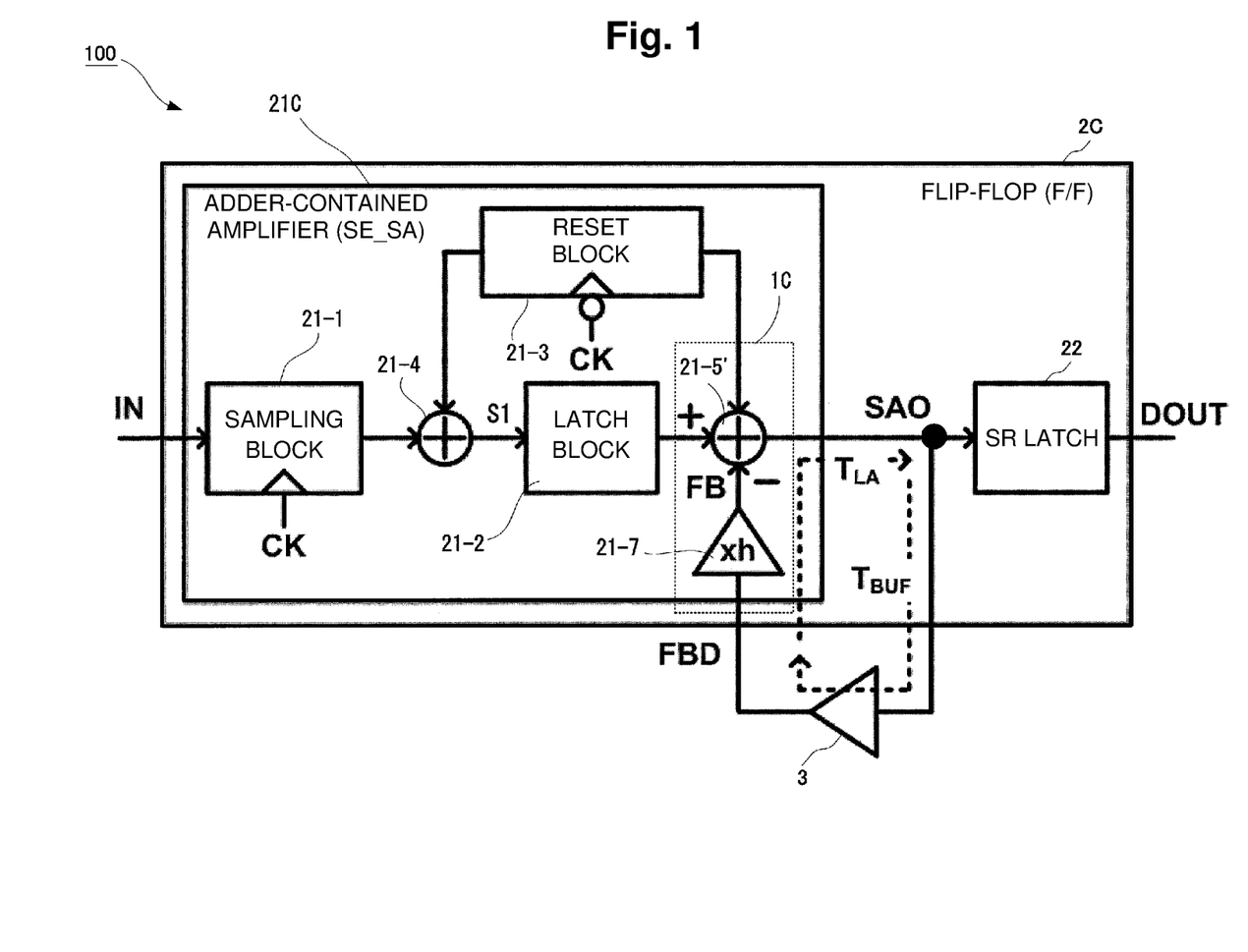
FIG. 1 is a diagram showing a configuration of essential parts of a decision feedback equalizer (DFE) according to Embodiment 1 of the present invention.

With reference to drawings, embodiments of the present invention will be described in detail below. FIG. 1 is a diagram showing essential parts of a decision feedback equalizer (DFE) 100 according to Embodiment 1 of the present invention. In FIG. 1, the same reference signs are given to the same constituent elements as the constituent elements described with reference to FIG. 7, and the description will be omitted.

In the DFE 100, in order to further reduce the feedback loop delay TFB, the amplifier output SAO is used as the feedback signal FBD through the buffer 3, and an amplifier (adder-contained amplifier (SE_SA)) having an adder 1C between the latch block 21-2 and the SR latch 22 is used.

In other words, in the DFE 100, the adder 1C having a combination of an addition unit 21-5' and an xh block 21-7 is provided within an amplifier 21C, and the xh block 21-7 transmits a feedback signal FB (analog signal) generated from a feedback signal FBD (digital signal) to the addition unit 21-5'.

In the DFE 100, a reset block 21-3 is controlled by a clock signal CK and resets output nodes of the sampling block 21-1 and the latch block 21-2. In this case, while the clock signal CK is having "Low", the output node of the sampling block 21-1 and the output node of the latch block 21-2 are pre-charged to VDD by the reset block 21-3. While the clock signal CK is having "High", the pre-charging to VDD of the output node of the sampling block 21-1 and the output node of the latch block 21-2 is cancelled, and the output from the sampling block 21-1 is transmitted to the latch block 21-2, and the output from the latch block 21-2 is transmitted to the addition unit 21-5'. In other words, the reset block 21-3 controls input timing of the output from the sampling block 21-1 to the latch block 21-2 and input timing of the output from the latch block 21-2 to the addition unit 21-5'. The purpose of the reset block 21-3 is pre-charging for a sampling operation or a latch operation to be performed next, and the timing is determined by the clock signal CK.

In the DFE 100, an operation for adding the output from the latch block 21-2 and the feedback signal FB from the xh block 21-7 occurs during the latch operation in the latch block 21-2.

Thus, compared with the conventional DFE 201 shown in FIG. 7, the delay time TSAM is removed, and the feedback loop delay TFB is reduced to TLA+TBUF. As a result, the operational data rate of the receiver can further be increased, and the intersymbol interference of a high speed signal can be compensated.

The amplifier 21C in the DFE 100 will be described with reference to a specific circuit configuration thereof. Here, a specific circuit configuration of the amplifier 21B in the conventional DFE 201 shown in FIG. 7 will be described first, and the specific circuit configuration of the amplifier 21C in the DFE 100 of this embodiment will then be described.

Figure 8:
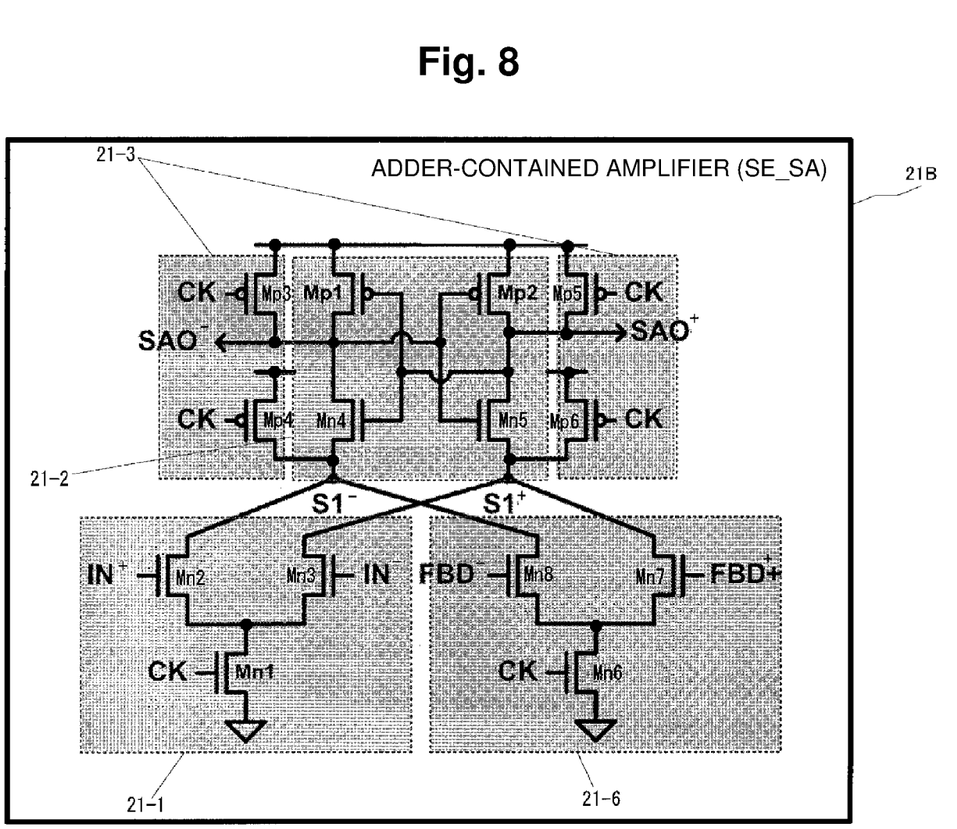
FIG. 8 is a diagram showing a specific circuit configuration of the amplifier in the DFE shown in FIG. 7.

FIG. 8 shows a specific circuit configuration of the amplifier 21B in the conventional DFE 201. This circuit is shown as a circuit in a case where the amplifier 21B is differential.

In the circuit configuration, IN+ is one component of an input signal IN input as a differential signal, and IN− is the other component. S1+ is one component of the latch block input S1 occurring as a differential signal, and S1− is the other component. FBD+ is one component of the feedback signal FBD transmitted as a differential signal, and FBD− is the other component. SAO+ is one component of the amplifier output SAO output as a differential signal, and SAO− is the other component.

In the amplifier 21B, the sampling block 21-1 includes an N-channel MOS transistor Mn1, an N-channel MOS transistor Mn2, and an N-channel MOS transistor Mn3. Here, the N-channel MOS transistor Mn1 has a source connected to a ground line and a gate that receives input of a clock signal CK. The N-channel MOS transistor Mn2 has a source connected to a drain of the N-channel MOS transistor Mn1 and a gate that receives input of the input signal IN+. The N-channel MOS transistor Mn3 has a source connected to the drain of the N-channel MOS transistor Mn1 and a gate that receives input of the input signal IN−.

The latch block 21-2 includes a P-channel MOS transistor Mp1, a P-channel MOS transistor Mp2, an N-channel MOS transistor Mn4, and an N-channel MOS transistor Mn5. Here, the P-channel MOS transistor Mp1 and the P-channel MOS transistor Mp2 have sources connected to a power supply line. The N-channel MOS transistor Mn4 has a drain connected to a drain of the P-channel MOS transistor Mp1, a gate connected to a gate of the P-channel MOS transistor Mp1, and a source connected to a drain of the N-channel MOS transistor Mn2. A drain, a gate and a source of the N-channel MOS transistor Mn5 are connected in the way described below. The drain of the N-channel MOS transistor Mn5 is connected to the drain of the P-channel MOS transistor Mp2 and a connection point between the gate of the P-channel MOS transistor Mp1 and the gate of the N-channel MOS transistor Mn4. The gate of the N-channel MOS transistor Mn5 is connected to a gate of the P-channel MOS transistor Mp2 and a connection point between the drain of the P-channel MOS transistor Mp1 and the drain of the N-channel MOS transistor Mn4. The source of the N-channel MOS transistor Mn5 is connected to a drain of the N-channel MOS transistor Mn3.

The reset block 21-3 includes a P-channel MOS transistor Mp3, a P-channel MOS transistor Mp4, a P-channel MOS transistor Mpg, and a P-channel MOS transistor Mph. Here, the P-channel MOS transistor Mp3 has a source connected to the power supply line, a drain connected to a connection point between the drain of the P-channel MOS transistor Mp1 and the drain of the N-channel MOS transistor Mn4, and a gate that receives input of a clock signal CK. The P-channel MOS transistor Mp4 has a source connected to the power supply line, a drain connected to a connection point between the source of the N-channel MOS transistor Mn4 and a drain of the N-channel MOS transistor Mn2, and a gate that receives input of a clock signal CK. The P-channel MOS transistor Mpg has a source connected to the power supply line, a drain connected to a connection point between the drain of the P-channel MOS transistor Mp2 and the drain of the N-channel MOS transistor Mn5, and a gate that receives input of a clock signal CK. The P-channel MOS transistor Mp6 has a source connected to the power supply line, a drain connected to a connection point between the source of the N-channel MOS transistor Mn5 and the drain of the N-channel MOS transistor Mn3, and a gate that receives input of a clock signal CK.

The xh block 21-6 includes an N-channel MOS transistor Mn6, an N-channel MOS transistor Mn7, and an N-channel MOS transistor Mn8. Here, the N-channel MOS transistor Mn6 has a source connected to the ground line and a gate that receives input of the clock signals CK. The N-channel MOS transistor Mn7 has a source connected to a drain of the N-channel MOS transistor Mn6, a drain connected to a connection point between the source of the N-channel MOS transistor Mn5 and the drain of the P-channel MOS transistor Mp6, and a gate that receives input of the feedback signal FBD+. The N-channel MOS transistor Mn8 has a source connected to the drain of the N-channel MOS transistor Mn6, a drain connected to a connection point between the drain of the P-channel MOS transistor Mp4 and the source of the N-channel MOS transistor Mn4, and a gate that receives input of the feedback signal FBD−.

Figure 9:
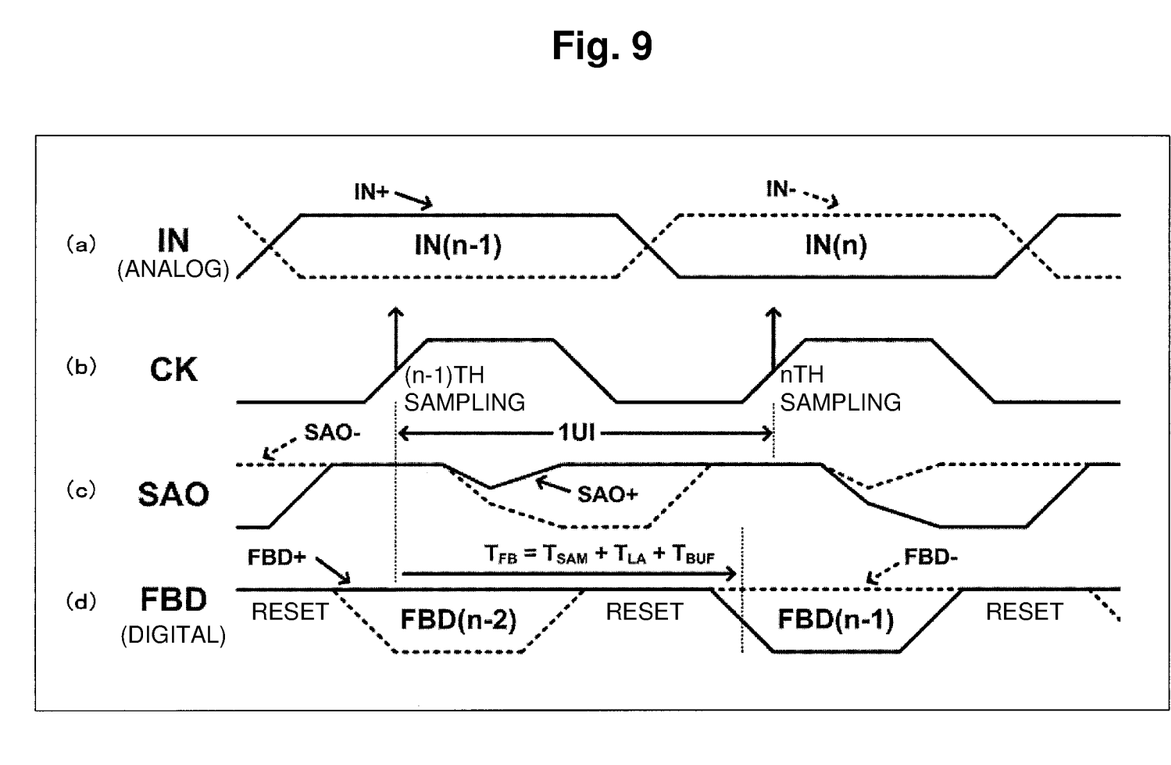
FIG. 9 is a timing chart showing operations of the DFE using the amplifier shown in FIG. 8.

FIG. 9 shows a timing chart indicating operations of the DFE 201 including the amplifier 21B shown in FIG. 8. In the DFE 201 including the amplifier 21B, when the clock signal CK has "Low", the nodes of S1+, S1−, SAO+ and SAO− are charged to VDD by the reset block 21-3. When the clock signal CK is shifted to "High", the sampling block 21-1 and the xh block 21-6 start pulling current from the two nodes of S1+ and S1−.

At the two nodes of S1+ and S1−, the current by the sampling block 21-1 is added to the current by the xh block 21-6. The added current is transmitted to the two nodes of SAO+ and SAO−. As a result, in a sampling operation, SAO− depends on the current by IN+, and FBD− and SAO+ depend on current by IN− and FBD+.

After the sampling operation, VDI that is "SAO$^+$−SAO$^-$" is α*{(IN$^+$−IN$^-$)−h*(FBD$^+$−FBD$^-$)}. Here, α is a gain of the sampling operation, and h is an intersymbol interference coefficient depending on the ratio between the current flowing in the N-channel MOS transistor Mn1 and the current flowing in the N-channel MOS transistor Mn6. Because FBD+ and FBD− are digital signals of "1" or "0", VDI is α*{(IN$^+$−IN$^-$)±h}. However, this is the same result as that of a case where the DFE 201 shown in FIG. 7 has a single-end architecture.

When SAO$^+$ or SAO$^-$ is lower than "VDD−V$_{TH}$", the P-channel MOS transistors Mp1 and Mp2 are turned on, and the latch block 21-2 starts a latch operation. V$_{TH}$ is a threshold voltage of the P-channel MOS transistors Mp1 and Mp2. After the latch operation, one of SAO+ and SAO is shifted to have V$_{DD}$, and the other one is shifted to have V$_{SS}$.

In the DFE 201 including the differential amplifier 21B, in order to properly remove the intersymbol interference, FBD$^+$ and FBD$^-$ of the (n−1)th data are required to arrive before the n-th sampling of the clock signal CK. Therefore, the feedback loop delay T$_{FB}$ (T$_{FB}$=T$_{SAM}$+T$_{LA}$+T$_{BUF}$) is required to be smaller than 1 UI.

Figure 2:
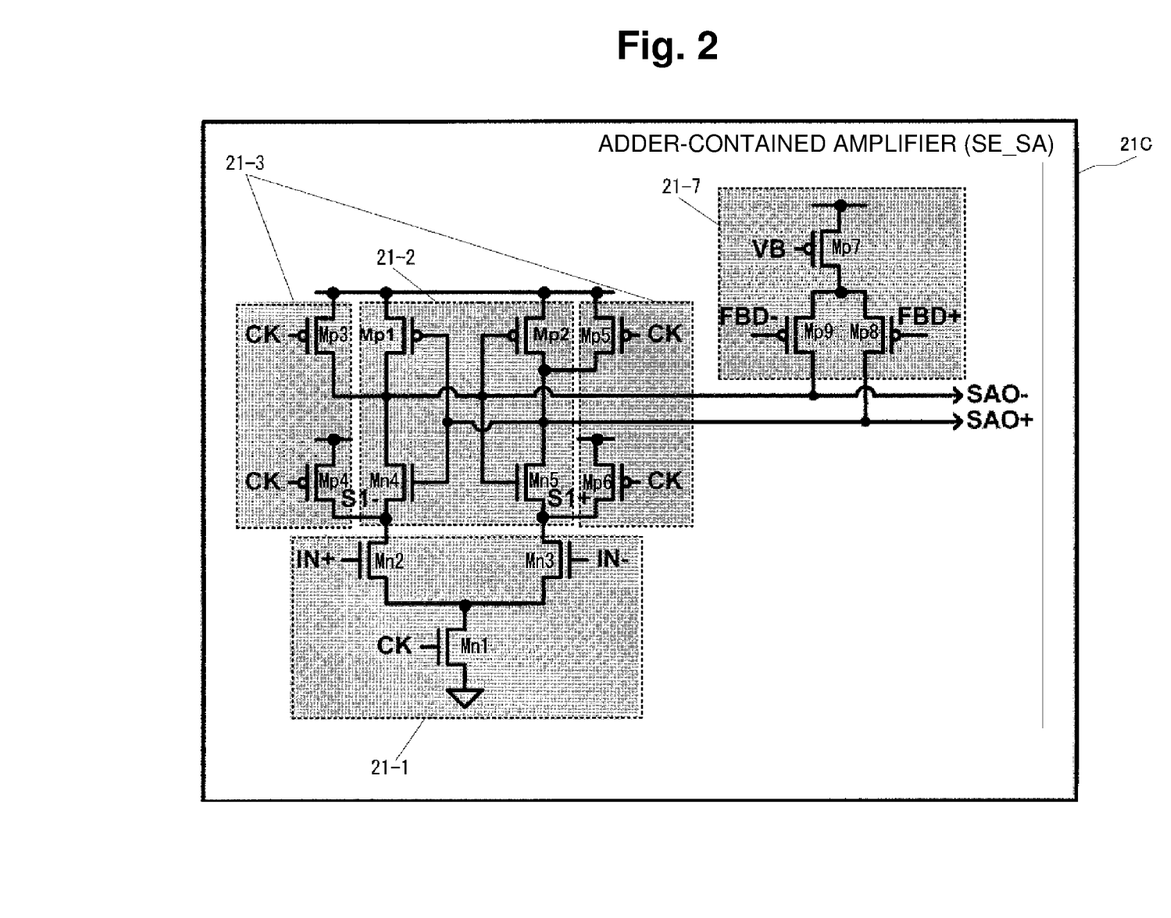
FIG. 2 is a diagram showing a specific circuit configuration of an amplifier (adder-contained amplifier) in the DFE shown in FIG. 1.
Figure 3:
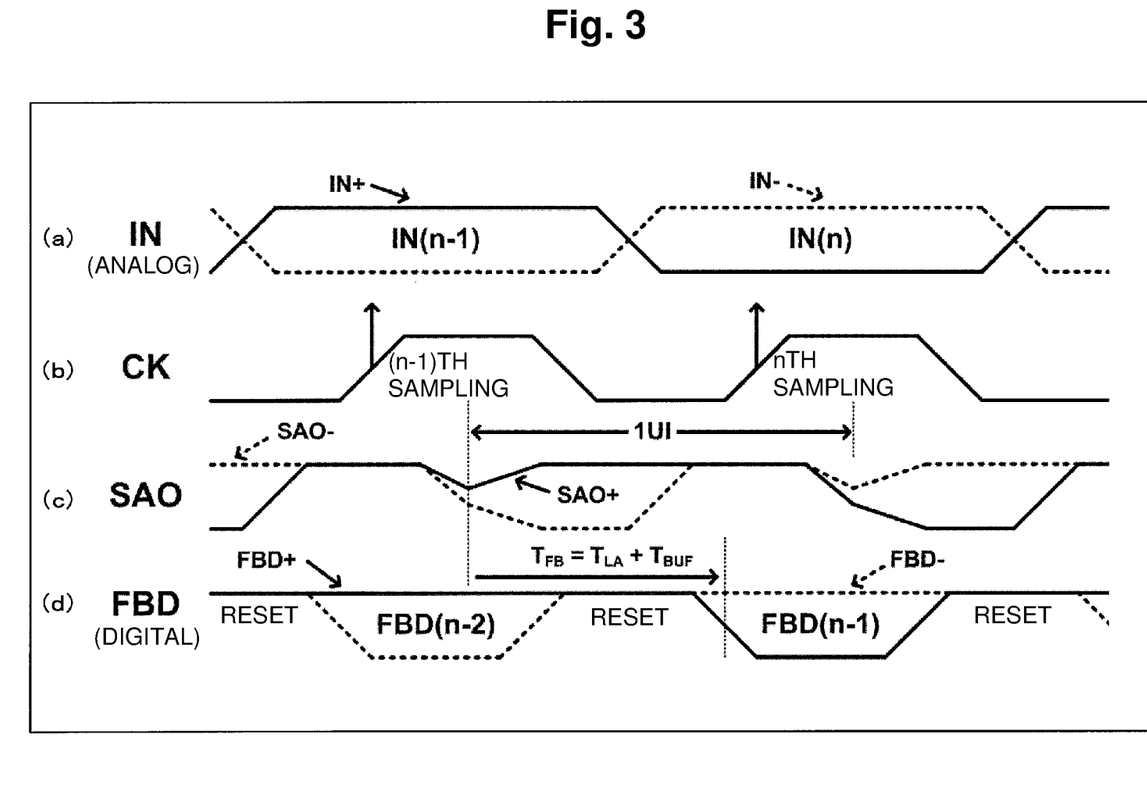
FIG. 3 is a timing chart showing operations of the DFE using the amplifier shown in FIG. 2.

FIG. 2 shows a specific circuit configuration of the amplifier 21C in the DFE too (FIG. 1) of this embodiment. This circuit is also shown as a circuit in a case where the amplifier 21C is differential. FIG. 3 shows a timing chart corresponding to FIG. 9.

In this circuit, instead of the xh block 21-6 in the conventional amplifier 21B shown in FIG. 8, an xh block 21-7 using P-channel MOS transistors Mp7 to Mp9 is used.

Because configurations of a sampling block 21-1, a latch block 21-2 and a reset block 21-3 in this circuit are the same as the configurations of the sampling block 21-1, the latch block 21-2 and the reset block 21-3 in the amplifier 21B shown in FIG. 8, the description will be omitted.

In the amplifier 21C, the xh block 21-7 includes a P-channel MOS transistor Mp7, a P-channel MOS transistor Mp8, and a P-channel MOS transistor Mp9. Here, the P-channel MOS transistor Mp7 has a source connected to a power supply line and a gate that receives input of a control voltage VB. A drain, a gate and a source of the P-channel MOS transistor Mp8 are connected in the way described below. The source of the P-channel MOS transistor Mp8 is connected to a drain of the P-channel MOS transistor Mp7. The drain of the P-channel MOS transistor Mp8 is connected to a connection point between the gate of the P-channel MOS transistor Mp1 and the gate of the N-channel MOS transistor Mn4 and a connection point between the drain of the P-channel MOS transistor Mp2 and the drain of the N-channel MOS transistor Mn5. The gate of the P-channel MOS transistor Mp8 receives input of the feedback signal FBD+. A drain, a gate and a source of the P-channel MOS transistor Mp9 are connected in the way described below. The source of the P-channel MOS transistor Mp9 is connected to the drain of the P-channel MOS transistor Mp7. The drain of the P-channel MOS transistor Mp9 is connected to a connection point between the drain of the P-channel MOS transistor Mp1 and the drain of the N-channel MOS transistor Mn4 and a connection point between the gate of the P-channel MOS transistor Mp2 and the gate of the N-channel MOS transistor Mn5. The gate of the P-channel MOS transistor Mp9 receives input of the feedback signal FB$^-$.

In the amplifier 21C, an offset voltage of −α*h*(FBD$^+$−FBD$^-$) is added to the output from the latch block 21-2 by the xh block 21-7. Because of this addition of the offset voltage, VDI is α*(IN$^+$−IN$^-$)−α*h*(FBD$^+$−FBD$^-$). This exhibits the same result as that of the amplifier 21B shown in FIG. 8. α*h is controlled by a control voltage VB.

In the amplifier 21C, because the offset voltage is added to the output from the latch block 21-2, the arrival time of the feedback signal (FBD$^+$, FBD$^-$) is alleviated to the starting time of a latch operation. In other words, in order to properly remove the intersymbol interference, FBD$^+$ and FBD$^-$ of the (n−1)th data are required to arrive before the latch operation of the n-th data.

Because the feedback loop includes a latch operation in the amplifier 21C and a buffer operation in the buffer 3, the feedback loop delay T$_{FB}$ is T$_{LA}$+T$_{BUF}$. In this amplifier 21C, T$_{FB}$ is smaller than that of the conventional amplifier 21B, providing an effect that the operational data rate of the DFE 100 is further increased.

Embodiment 2

Figure 4:
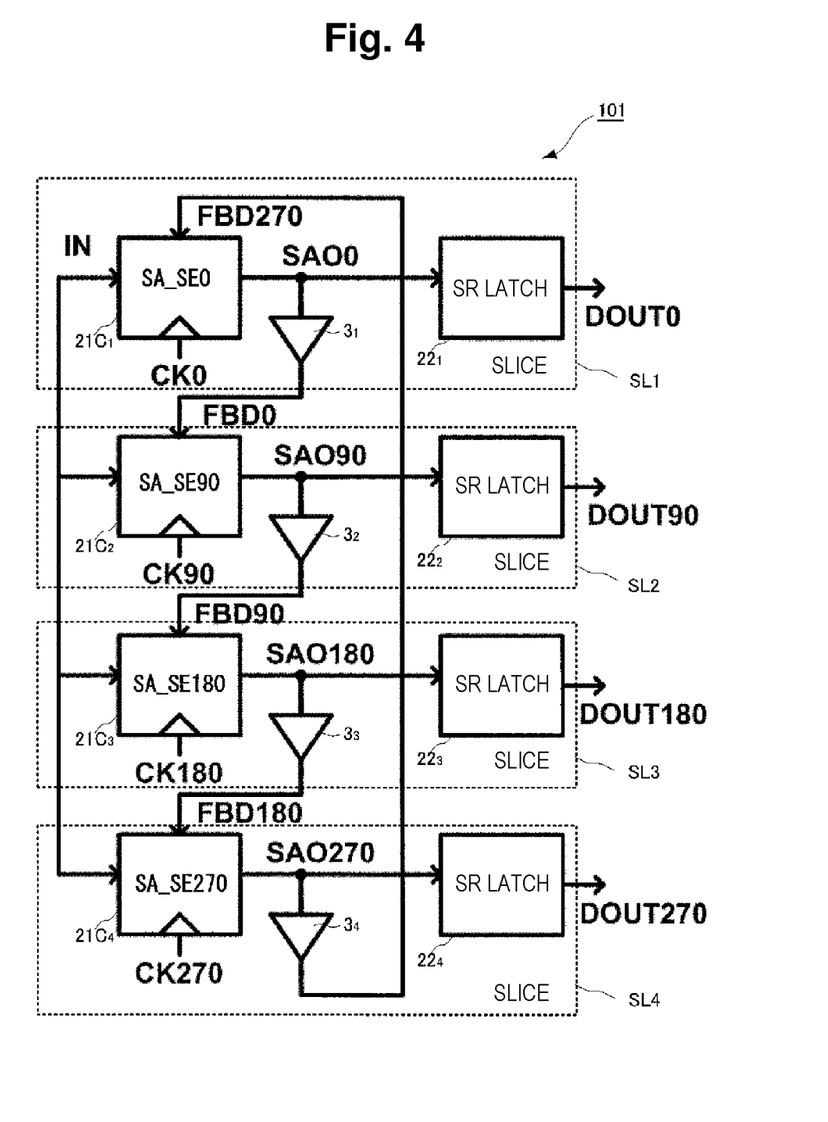
FIG. 4 is a diagram showing a configuration of essential parts of a DFE having a ¼ rate architecture (DFE according to Embodiment 2).

The DFE 100 shown in FIG. 1 can be implemented as a ¼ rate architecture. FIG. 4 shows a configuration of essential parts of a DFE 101 having a ¼ rate architecture. The DFE 101 includes four slices SL1 to SL4 where one slice includes a combination of the amplifier 21C, the SR latch 22 and the buffer 3 shown in FIG. 1.

The first slice SL1 includes an amplifier $21C_1$, an SR latch $22_1$, and a buffer $3_1$. The second slice SL2 includes an amplifier $21C_2$, an SR latch $22_2$, and a buffer $3_2$. The third slice SL3 includes an amplifier $21C_3$, an SR latch $22_3$, and a buffer $3_3$. The fourth slice SL4 includes an amplifier $21C_4$, an SR latch $22_4$, and a buffer $3_4$.

In the DFE 101, the xh block 21-7 within the amplifier $21C_1$ in the first slice SL1 generates a feedback signal FB from an output from the amplifier $21C_4$ in the final (fourth) slice SL4, which is fed back through the buffer $3_4$ in the final (fourth) slice SL4, instead of an output from the amplifier $21C_1$, which is fed back through the buffer $3_1$ in the first slice SL1.

The amplifier $21C_2$ in the second slice SL2 generates a feedback signal FB from an output from the amplifier $21C_1$ in the preceding slice SL1, which is fed back through the buffer $3_1$ in the preceding slice SL1, instead of an output from the amplifier $21C_2$ in the second slice SL2, which is fed back through the buffer $3_2$ in the second slice SL2.

The amplifier $21C_3$ in the third slice SL3 generates a feedback signal FB from an output from the amplifier $21C_2$ in the preceding slice SL2, which is fed back through the buffer $3_2$ in the preceding slice SL2, instead of an output from the amplifier $21C_3$ in the third slice SL3, which is fed back through the buffer $3_3$ in the third slice SL3.

The amplifier $21C_4$ in the fourth slice SL4 generates a feedback signal FB from an output from the amplifier $21C_3$ in the preceding slice SL3, which is fed back through the buffer $3_3$ in the preceding slice SL3, instead of an output from the amplifier $21C_4$ in the fourth slice SL4, which is fed back through the buffer $3_4$ in the fourth slice SL4.

In this DFE 101, the amplifiers $21C_1$, $21C_2$, $21C_3$ and $21C_4$ are synchronized by a clock signal CK0, a clock signal CK90, a clock signal CK180 and a clock signal CK270, respectively. In this example, it is assumed that the amplifiers $21C_1$, $21C_2$, $21C_3$ and $21C_4$ have the circuit configuration shown in FIG. 2.

The clock signals CK0, CK90, CK180 and CK270 have a cycle of 4×UI where UI is the same as the RX input. Sampling operations are sequentially performed in the amplifiers $21C_1$, $21C_2$, $21C_3$ and $21C_4$ in order of the clock signal CK0, the clock signal CK90, the clock signal CK180, and the clock signal CK270. The amplifier $21C_2$ starts a sampling operation by using the clock signal CK90 after one UI from the sampling by the clock signal CK0 in the amplifier $21C_1$.

After the next one UI, the amplifier $21C_3$ starts a sampling operation by using the clock signal CK180. After the further next one UI, the amplifier $21C_4$ starts a sampling operation. Then, after the further next one UI, the amplifier $21C_1$ starts a sampling operation again. The sampling operations are repeated in the order described above.

For a DFE operation, an amplifier output SAO0 that is an output from the amplifier $21C_1$ synchronized by the clock signal CK0 is transmitted to the amplifier $21C_2$ as FBD0 through the buffer $3_1$. An amplifier output SAO90 that is an output from the amplifier $21C_2$ synchronized by the clock signal CK90 is transmitted to the amplifier $21C_3$ as FBD90 through the buffer $3_2$. An amplifier output SAO180 that is an output from the amplifier $21C_3$ synchronized by the clock signal CK180 is transmitted to the amplifier $21C_4$ as FBD180 through the buffer $3_3$. An amplifier output SAO270 that is an output from the amplifier $21C_4$ synchronized by the clock signal CK270 is transmitted to the amplifier $21C_1$ as FBD270 through the buffer $3_4$.

Expansion of the Embodiments

Having described the present invention with reference to the embodiments, the present invention is not limited to the embodiments. Various changes that can be understood by those skilled in the art without departing from the technical spirit of the present invention can be made to the configuration and details of the present invention.

REFERENCE SIGNS LIST

1C Adder
2C Flip-flop
3, 31 to 34 Buffer
21C, 21C1 to 21C4 Amplifier (adder-contained amplifier)
21-1 Sampling block
21-2 Latch block
21-3 Reset block
21-4 Addition unit
21-5' Addition unit
21-7 xh block
22, 221 to 224 SR latch
Mp1 to Mp9 P-channel MOS transistor
Mn1 to Mn5 N-channel MOS transistor
SL1 to SL4 Slice
100, 101 DFE
22, 221 to 224 SR latch
Mp1 to Mp9 P-channel MOS transistor
Mn1 to Mn5 N-channel MOS transistor
SL1 to SL4 Slice
100, 101 DFE.

The invention claimed is:

1. A decision feedback equalizer that compensates an intersymbol interference caused by a dispersion property of a channel between a transmitter and a receiver, the decision feedback equalizer comprising:
  an amplifier configured to: receive, as an input signal, an analog signal transmitted from the transmitter to the receiver through the channel and amplify and output the input signal as a return-to-zero digital signal;
  a first latch circuit configured to latch and output the return-to-zero digital signal as a non-return-to-zero digital signal; and
  a buffer on a path for feeding back the output from the amplifier to the amplifier, wherein the amplifier includes:
    a sampling circuit configured to sample and output the input signal at predetermined cycles;
    a second latch circuit configured to latch and output an output corresponding to the sampling circuit;
    an adder including:
      a feedback signal generation circuit configured to generate a feedback signal depending on an amount of the intersymbol interference from an output of the amplifier and feed back the feedback signal through the buffer; and
      an addition circuit configured to add the feedback signal to the output of the second latch circuit; and
    a reset circuit configured to control input timing of the output from the sampling circuit to the second latch circuit and control input timing of the output from the second latch circuit to the addition circuit.

2. The decision feedback equalizer according to claim 1, wherein the sampling circuit includes:
  a first N-channel metal-oxide semiconductor (MOS) transistor having a source connected to a ground line and a gate that receives input of a clock signal;

a second N-channel MOS transistor having a source connected to a drain of the first N-channel MOS transistor and a gate that receives input of a first component of the input signal as a differential signal; and a third N-channel MOS transistor having a source connected to the drain of the first N-channel MOS transistor and a gate that receives input of a second component of the input signal input as the differential signal.

3. The decision feedback equalizer according to claim 2, wherein the second latch circuit includes:

a first P-channel MOS transistor and a second P-channel MOS transistor each having a source connected to a power supply line;

a fourth N-channel MOS transistor having:
  a drain connected to a drain of the first P-channel MOS transistor;
  a gate connected to a gate of the first P-channel MOS transistor;
  and a source connected to a drain of the second N-channel MOS transistor; and a fifth N-channel MOS transistor having:
  a drain connected to a drain of the second P-channel MOS transistor, the gate of the first P-channel MOS transistor, and the gate of the fourth N-channel MOS transistor;
  a gate connected to a gate of the second P-channel MOS transistor and the drain of the first P-channel MOS transistor; and
  a source connected to a drain of the third N-channel MOS transistor.

4. The decision feedback equalizer according to claim 3, wherein the reset circuit includes:

a third P-channel MOS transistor having a source connected to the power supply line, a drain connected to the drain of the first P-channel MOS transistor and the drain of the fourth N-channel MOS transistor, and a gate that receives input of a clock signal;

a fourth P-channel MOS transistor having a source connected to the power supply line, a drain connected to the source of the fourth N-channel MOS transistor and the drain of the second N-channel MOS transistor, and a gate that receives input of a clock signal;

a fifth P-channel MOS transistor having a source connected to the power supply line, a drain connected to the drain of the second P-channel MOS transistor and the drain of the fifth N-channel MOS transistor, and a gate that receives input of a clock signal; and a sixth P-channel MOS transistor having a source connected to the power supply line, a drain connected to the source of the fifth N-channel MOS transistor and the drain of the third N-channel MOS transistor, and a gate that receives input of a clock signal.

5. The decision feedback equalizer according to claim 4, wherein the feedback signal generation circuit includes:

a seventh P-channel MOS transistor having a source connected to the power supply line and a gate that receives input of a control voltage;

an eighth P-channel MOS transistor having a source connected to a drain of the seventh P-channel MOS transistor, a drain connected to the gate of the first P-channel MOS transistor, the gate of the fourth N-channel MOS transistor, the drain of the second P-channel MOS transistor, and the drain of the fifth N-channel MOS transistor, and a gate that receives a first component of the output from the amplifier fed back as a differential signal through the buffer; and a ninth P-channel MOS transistor having a source connected to the drain of the seventh P-channel MOS transistor, a drain connected to the drain of the first P-channel MOS transistor, the drain of the fourth N-channel MOS transistor, the gate of the second P-channel MOS transistor, and the gate of the fifth N-channel MOS transistor, and a gate that receives input of a second component of the output from the amplifier fed back as the differential signal through the buffer.

6. The decision feedback equalizer according to claim 1, comprising:

a plurality of slices, wherein each the plurality of slices includes a combination of the amplifier, the latch circuit, and the buffer;

wherein a first feedback signal generation circuit included in a first amplifier in a first slice of the plurality of slices generates a first feedback signal from a final output from a final amplifier in a final slice of the plurality of slices, which is fed back through a final buffer in the final slice; and a respective feedback signal generation circuit within a respective amplifier in each slice of the plurality of slices excluding the first slice generates a respective feedback signal from a respective output from a respective amplifier in a preceding slice, which is fed back through a respective buffer in the preceding slice.

7. A decision feedback equalizer that compensates an intersymbol interference caused by a dispersion property of a channel between a transmitter and a receiver, the decision feedback equalizer comprising:

an amplifier configured to: receive, as an input signal, an analog signal transmitted from the transmitter to the receiver through the channel and amplify and output the input signal as a return-to-zero digital signal;

a latch circuit configured to latch and output the return-to-zero digital signal as a non-return-to-zero digital signal; and a buffer on a path for feeding back the output from the amplifier to the amplifier, wherein the amplifier includes:
  a sampling circuit configured to sample and output the input signal at predetermined cycles;
  a second latch circuit configured to latch and output an output corresponding to the sampling circuit; and
  an adder including:
    a feedback signal generation circuit configured to generate a feedback signal depending on an amount of the intersymbol interference from an output of the amplifier and feed back the feedback signal through the buffer; and
    an addition circuit configured to add the feedback signal to the output of the second latch circuit.

8. The decision feedback equalizer according to claim 7, wherein the amplifier further comprises a reset circuit configured to control input timing of the output from the sampling circuit to the second latch circuit and control input timing of the output from the second latch circuit to the addition circuit.

9. A method for compensating an intersymbol interference caused by a dispersion property of a channel between a transmitter and a receiver, the method comprising:

receiving, by an amplifier as an input signal, an analog signal transmitted from the transmitter to the receiver through the channel and amplify and output the input signal as a return-to-zero digital signal;

latching and outputting, by a first latch circuit, the return-to-zero digital signal as a non-return-to-zero digital signal, wherein a buffer is provided on a path for feeding back the output from the amplifier to the amplifier;

sampling and outputting, by a sampling circuit of the amplifier, the input signal at predetermined cycles;

latching and outputting, by a second latch circuit of the amplifier, an output corresponding to the sampling circuit;

generating, by the amplifier, a feedback signal depending on an amount of the intersymbol interference from an output of the amplifier and feed back the feedback signal through the buffer; and adding, by the amplifier, the feedback signal to the output of the second latch circuit.

10. The method according to claim 9, wherein the amplifier further comprises a reset circuit configured to control input timing of the output from the sampling circuit to the second latch circuit and control input timing of the output from the second latch circuit to the addition circuit.

* * * * *